(12) United States Patent
Li et al.

(10) Patent No.: US 10,680,063 B2
(45) Date of Patent: Jun. 9, 2020

(54) METHOD OF MANUFACTURING STACKED SIGE NANOTUBES

(71) Applicant: International Business Machines Corporation, Armonk, NY (US)

(72) Inventors: Juntao Li, Cohoes, NY (US); Kangguo Cheng, Schenectady, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/125,311

(22) Filed: Sep. 7, 2018

(65) Prior Publication Data

US 2020/0083328 A1    Mar. 12, 2020

(51) Int. Cl.
| | |
|---|---|
| *H01L 21/02* | (2006.01) |
| *H01L 21/311* | (2006.01) |
| *H01L 21/324* | (2006.01) |
| *G01N 27/12* | (2006.01) |
| *H01L 29/06* | (2006.01) |

(Continued)

(52) U.S. Cl.
CPC .... *H01L 29/0676* (2013.01); *H01L 21/02164* (2013.01); *H01L 21/02236* (2013.01); *H01L 21/02381* (2013.01); *H01L 21/02532* (2013.01); *H01L 21/283* (2013.01); *H01L 21/30604* (2013.01); *H01L 21/31111* (2013.01); *H01L 21/324* (2013.01); *H01L 29/16* (2013.01); *H01L 29/45* (2013.01); *G01N 27/127* (2013.01)

(58) Field of Classification Search
CPC . H01L 29/0657–0676; H01L 21/02532; H01L 21/02–02381; H01L 29/78681–78687; H01L 21/02518–02532
See application file for complete search history.

(56) References Cited

U.S. PATENT DOCUMENTS

| 7,544,626 B2 | 6/2009 | Tang et al. |
| 8,093,628 B2 | 1/2012 | Yang et al. |

(Continued)

FOREIGN PATENT DOCUMENTS

CN    105839146 A    8/2016

OTHER PUBLICATIONS

T. Tezuka et al., "Fabrication of strained Si on an Ultrathin SiGe-on-insulator virtual substrate with a high-Ge fraction," Applied Physics Letters, vol. 79, No. 12, pp. 1798-1800 (Sep. 2001).

(Continued)

*Primary Examiner* — Sonya D. McCall-Shepard
(74) *Attorney, Agent, or Firm* — Vazken Alexanian; Michael J. Chang, LLC

(57) ABSTRACT

Stacked SiGe nanotubes and techniques for the fabrication thereof are provided. In one aspect, a method of forming a SiGe nanotube stack includes: forming Si and SiGe layers on a wafer, one on top of another, in an alternating manner; patterning at least one fin in the Si and SiGe layers; depositing an oxide material onto the at least one fin; and annealing the at least one fin under conditions sufficient to diffuse Ge atoms from the SiGe layers along an interface between the oxide material and the Si and SiGe layers to form at least one vertical stack of SiGe nanotubes surrounding Si cores. A SiGe nanotube device and method for formation thereof are also provided.

16 Claims, 7 Drawing Sheets

(51) Int. Cl.
*H01L 29/16* (2006.01)
*H01L 29/45* (2006.01)
*H01L 21/306* (2006.01)
*H01L 21/283* (2006.01)

(56) References Cited

U.S. PATENT DOCUMENTS

| | | |
|---|---|---|
| 8,936,972 B2 | 1/2015 | Bangsaruntip et al. |
| 9,455,141 B2 | 9/2016 | Cheng et al. |
| 9,570,299 B1 | 2/2017 | Cheng et al. |
| 9,595,685 B2 | 3/2017 | Lieber et al. |
| 9,956,743 B2 | 5/2018 | Jin et al. |
| 2004/0253741 A1 | 12/2004 | Star et al. |
| 2012/0217468 A1 | 8/2012 | Tekleab et al. |
| 2016/0049336 A1* | 2/2016 | Han .................. H01L 21/3081 438/283 |
| 2016/0187276 A1 | 6/2016 | Briman et al. |
| 2017/0033182 A1* | 2/2017 | Cheng ................ H01L 29/1054 |
| 2017/0125526 A1* | 5/2017 | Hatem ............. H01L 21/02236 |
| 2017/0288040 A1* | 10/2017 | Augendre ......... H01L 29/66795 |
| 2019/0085240 A1* | 3/2019 | Liu ........................ C09K 13/02 |

OTHER PUBLICATIONS

Lee, "Electrodes for Semiconductor Gas Sensors," Sensors, 17, 683 (Mar. 2017) (19 pages).
Kong et al., "Nanotube Molecular Wires as Chemical Sensors," Science, vol. 287, pp. 622-625 (Jan. 2000).
English Translation of CN105839146A, dated Aug. 10, 2016 by Xiao Wei et al. (12 pages).

\* cited by examiner

METHOD OF MANUFACTURING STACKED SIGE NANOTUBES

FIELD OF THE INVENTION

The present invention relates to nanotube technology, and more particularly, to stacked silicon germanium (SiGe) nanotubes and techniques for the fabrication thereof.

BACKGROUND OF THE INVENTION

Nanotube structures such as carbon nanotubes are used for a variety of applications. Carbon nanotubes can be formed by chemical synthesis. The result, however, is a mixture of semiconducting and metallic carbon nanotubes.

The composition of nanotubes formed from a semiconductor such as silicon (Si) or silicon germanium (SiGe) can be controlled. However, with the techniques typically employed to fabricate semiconductor nanotubes such as chemical vapor deposition (CVD) or a gas phase condensation it is very difficult to achieve nanotubes with dimensional uniformity and alignment.

Therefore, improved techniques for forming semiconductor nanotubes would be desirable.

SUMMARY OF THE INVENTION

The present invention provides stacked silicon germanium (SiGe) nanotubes and techniques for the fabrication thereof. In one aspect of the invention, a method of forming a SiGe nanotube stack is provided. The method includes: forming silicon (Si) and SiGe layers on a wafer, one on top of another, in an alternating manner; patterning at least one fin in the Si and SiGe layers; depositing an oxide material onto the at least one fin; and annealing the at least one fin under conditions sufficient to diffuse germanium (Ge) atoms from the SiGe layers along an interface between the oxide material and the Si and SiGe layers to form at least one vertical stack of SiGe nanotubes surrounding Si cores.

In another aspect of the invention, a method of forming a SiGe nanotube device is provided. The method includes: forming Si and SiGe layers on a wafer, one on top of another, in an alternating manner; patterning at least one fin in the Si and SiGe layers; depositing an oxide material onto the at least one fin; annealing the at least one fin under conditions sufficient to diffuse germanium (Ge) atoms from the SiGe layers along an interface between the oxide material and the Si and SiGe layers to form at least one vertical stack of SiGe nanotubes surrounding Si cores; selectively removing the Si cores; removing the oxide material; and forming electrodes in contact with opposite ends of the at least one vertical stack of SiGe nanotubes.

In yet another aspect of the invention, a SiGe nanotube device is provided. The SiGe nanotube device includes: at least one vertical stack of hollow SiGe nanotubes on a wafer; and electrodes in contact with opposite ends of the at least one vertical stack of hollow SiGe nanotubes.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming a silicon germanium (SiGe) nanotube stack with controllable dimensions and good uniformity. Advantageously, the present techniques are fully compatible with current semiconductor manufacturing processes. For instance, as will be described in detail below, vertically stacked SiGe nanotube arrays can be formed on a substrate using conventional lithography techniques. Also, there are no alignment issues as compared with carbon nanotubes and silicon (Si) nanotubes grown by a chemical vapor deposition (CVD) technique. Further, the present techniques can form SiGe nanotube without the need of suspension of an Si core, which is more mechanically stable as compared with those made using conventional methods. See, for example, U.S. Pat. No. 8,936,972 issued to Bangsaruntip et al., entitled "Epitaxially Thickened Doped or Undoped Core Nanowire FET Structure and Method for Increasing Effective Device Width."

Figure 1:
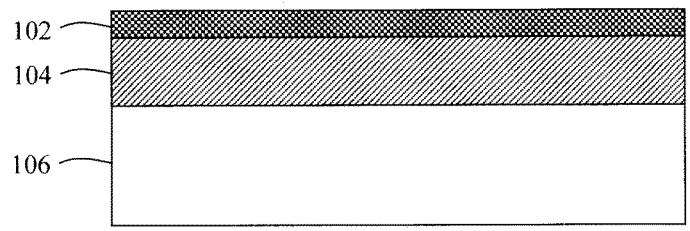
FIG. 1 is a cross-sectional diagram illustrating a starting silicon-on-insulator (SOI) wafer that includes a silicon-on-insulator or SOI layer separated from a substrate by a buried insulator according to an embodiment of the present invention.

An exemplary methodology for forming a SiGe nanotube stack is now described by way of reference to FIGS. 1-13. Referring to FIG. 1, the process begins with a silicon-on-insulator (SOI) wafer that includes a silicon-on-insulator or SOI layer 102 separated from a substrate 106 by a buried insulator 104. When the buried insulator is an oxide, it is also referred to herein as a buried oxide or BOX. Suitable substrates 106 include, but are not limited to, semiconductor substrates such as Si, Ge and/or SiGe substrates.

Figure 2:
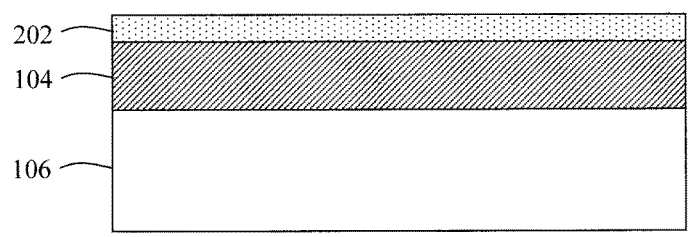
FIG. 2 is a cross-sectional diagram illustrating the SOI layer having been converted to a SiGe-on-insulator (SiGeOI) layer using a thermal oxidation-based germanium (Ge) condensation process according to an embodiment of the present invention.
Figure 3:
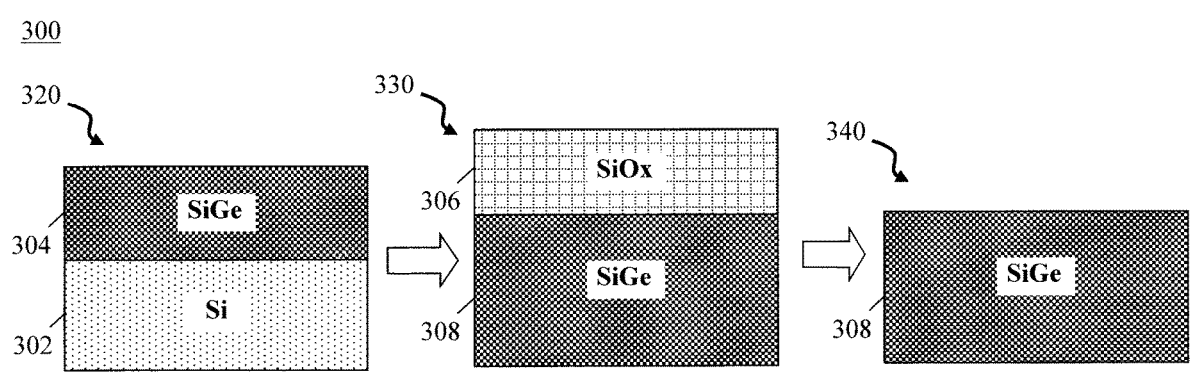
FIG. 3 is a diagram illustrating an exemplary methodology for thermal oxidation-based condensation according to an embodiment of the present invention.

The goal is to create alternating layers of Si and SiGe as a stack on the wafer, and ultimately at least one vertical SiGe nanotube stack. To do, the SOI layer 102 is first converted to SiGe forming what is referred to herein as a SiGe-on-insulator wafer. That way, the bottom-most SiGe nanotube formed will be directly on the wafer. Namely, as shown in FIG. 2, the SOI layer 102 has been converted to a SiGe-on-insulator (SiGeOI) layer 202 over the buried insulator 106.

According to an exemplary embodiment, the SOI layer 102 is converted to SiGeOI layer 202 using a thermal oxidation-based germanium (Ge) condensation process. The principles of this thermal oxidation-based condensation process are illustrated in methodology 300 of FIG. 3. As shown in step 320 of FIG. 3, a SiGe layer 304 is epitaxially grown on an Si layer 302 (such as the SOI layer 102 in the present process flow).

In step 330, an anneal in an oxygen-containing ambient (i.e., thermal oxidation) is then used to oxidize the SiGe layer 304, forming a silicon oxide (SiOx) layer 306 (such as the SiGeOI layer 202 in the present process flow). During the oxidation, Ge atoms are rejected from the silicon oxide (SiOx) layer 306 and condense in the underlying Si layer 302 forming a SiGe layer 308.

The thermal oxidation is performed at a temperature sufficient to cause diffusion of Ge out of SiGe layer 394 and into the underlying Si layer 302. According to an exemplary embodiment, the thermal oxidation is performed at a temperature of from about 700° C. to about 1300° C., and ranges therebetween, for example, at a temperature of from about 1000° C. to about 1200° C. and ranges therebetween, for a duration of from about 5 seconds to about 5 hours and ranges therebetween, for example from about 5 minutes to about 30 minutes and ranges therebetween (depending on thermal oxidation temperature and oxidation species), in an ambient containing at least one oxygen-containing gas. Suitable oxygen-containing gases include, but are not limited to, oxygen ($O_2$), nitric oxide (NO), nitrous oxide ($N_2O$), ozone and/or air. In some embodiments, the oxygen-containing gases are admixed with one another (such as an admixture of $O_2$ and NO). In other embodiments, the oxygen-containing gas is diluted with an inert gas such as helium (He), argon (Ar), nitrogen ($N_2$), xenon (Xe), krypton (Kr) and/or neon (Ne). In various embodiments, the thermal oxidation process may be carried out at a single targeted temperature, or various ramp and soak cycles may be utilized using various ramp rates and soak times. Exemplary thermal oxidation-based Ge condensation processes that may be employed in accordance with the present techniques are described, for example, in U.S. Pat. No. 9,455,141 issued to Cheng et al., entitled "Silicon-Germanium Fin of Height Above Critical Film thickness" and T. Tezuka et al., "Fabrication of strained Si on an Ultrathin SiGe-on-insulator virtual substrate with a high-Ge fraction," Applied Physics Letters, Volume 79, Number 12, pps. 1798-1800 (September 2001), the contents of both of which are incorporated by reference as if fully set forth herein.

In step 340, following oxidation the SiOx layer 306 is removed. According to an exemplary embodiment, the SiOx layer 306 is removed using, for example, a wet etch process, such as etching in hydrofluoric acid (HF).

Alternating layers 402a,b,c, etc. and 404a,b,c, etc. of Si and SiGe, respectively, are then formed as a stack on the wafer over SiGeOI layer 202. See FIG. 4. According to an exemplary embodiment, the Si layers 402a,b,c, etc. and SiGe layers 404a,b,c, etc. are epitaxially grown on the wafer, one on top of the other. As will be described in detail below, the Si layers 402a,b,c, etc. will ultimately define the inner cavity of the SiGe nanotubes in the nanotube stack. Thus, the dimensions of the Si layers 402a,b,c, etc. can be tailored to achieve nanotubes of a particular dimension.

Figure 4:
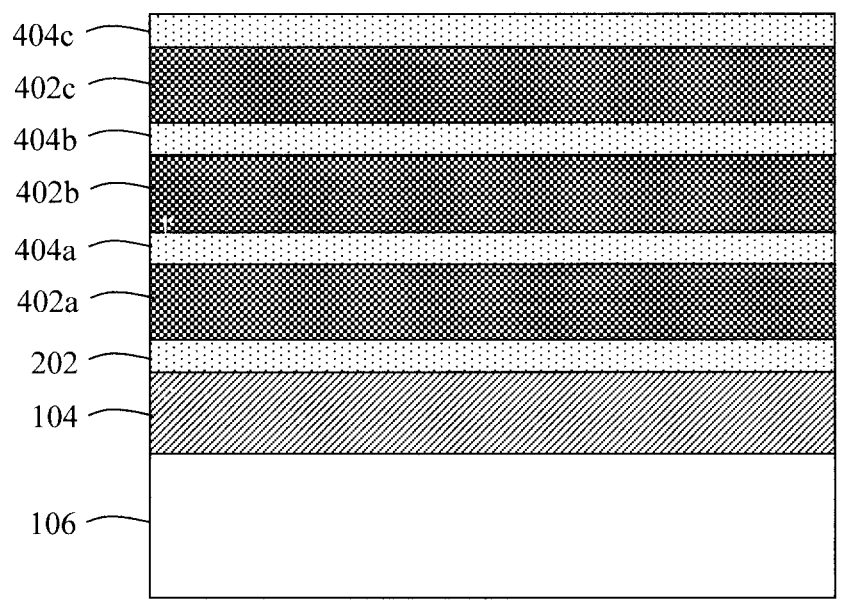
FIG. 4 is a cross-sectional diagram illustrating alternating layers. of Si and SiGe having been formed as a stack on the wafer according to an embodiment of the present invention.
Figure 5:
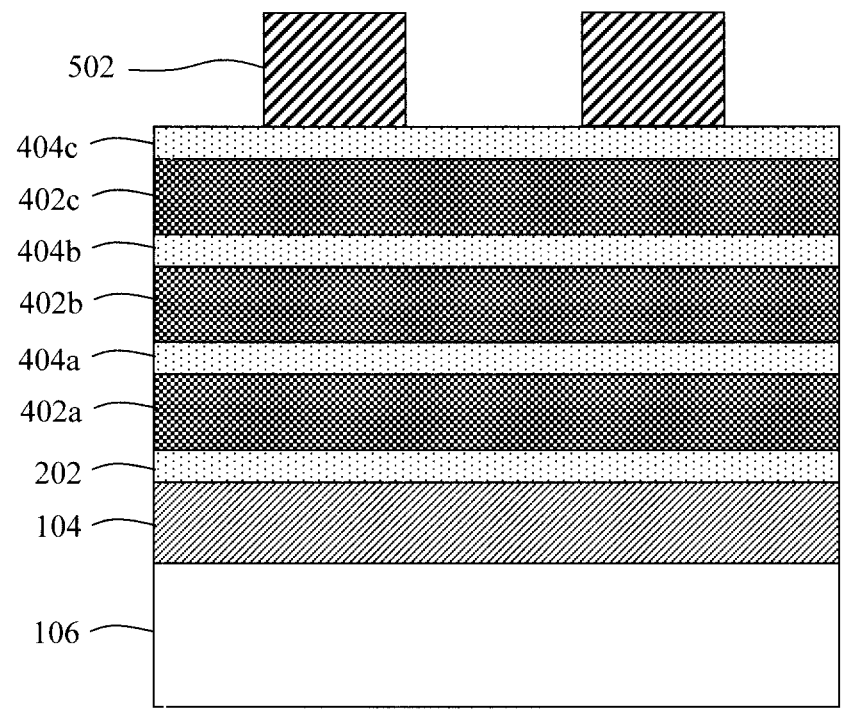
FIG. 5 is a cross-sectional diagram illustrating at least one fin hardmask having been formed on top of the stack of Si/SiGe layers according to an embodiment of the present invention.

For instance, as shown in FIG. 4, the Si layers 402a,b,c, etc. employed can be thicker than the SiGeOI layer 202/ SiGe layers 404a,b,c, etc. Generally, increasing the thickness of the Si layers 402a,b,c, etc. relative to the thickness of the SiGeOI layer 202/SiGe layers 404a,b,c, etc. will increase the dimensions of the cavity of the nanotubes relative to the thickness of the sidewalls of the nanotubes. By way of example only, according to an exemplary embodiment, each of the Si layers 402a,b,c, etc. has a thickness of from about 5 nanometers (nm) to about 10 nm and ranges therebetween, and each of the SiGeOI layer 202/SiGe layers 404a,b,c, etc. has a thickness of from about 10 nm to about 20 nm and ranges therebetween.

Further, it is notable that the number of Si/SiGe layers 402/404a,b,c, etc. shown in the figures is merely an example intended to illustrate the present techniques. Namely, embodiments are contemplated herein where more, or fewer, Si/SiGe layers 402/404 (than shown) are employed. Adding more Si/SiGe layers 402/404 will increase the number of SiGe nanotubes formed in the nanotube stack. Conversely, reducing the number of Si/SiGe layers 402/404 will reduce the number of SiGe nanotubes formed in the nanotube stack.

Standard lithography and etching techniques are then employed to pattern at least one fin hardmask 502 on top of the stack of Si/SiGe layers 402/404. See FIG. 5. Suitable hardmask materials include, but are not limited to, silicon nitride (SiN). The fin hardmask(s) 502 mark the footprint and location of (at least one) fin that will be patterned in the stack of Si/SiGe layers 402/404 (see below). Each fin corresponds to the formation of one SiGe nanotube stack on the wafer via the present process. Thus, one can tailor the number of fin hardmasks 502 formed depending on the how many SiGe nanotube stacks are desired in the end product. For instance, two fins hardmasks 502 correlate with two nanotube stacks, and so on.

The fin hardmasks 502 are then used to pattern at least one fin 602 in the Si/SiGe layers 402/404. See FIG. 6. In the present example, multiple fins 602 (i.e., fins 602a,b, etc.) are patterned in the Si/SiGe layers 402/404. The patterned portions of the Si/SiGe layers 402/404 in the fins 602a,b, etc. are now given the reference numerals 402'/404', 402''/404'', respectively. By way of example only, a directional (anisotropic) etching process such as reactive ion etching (RIE) can be used for the fin etch.

Figure 6:
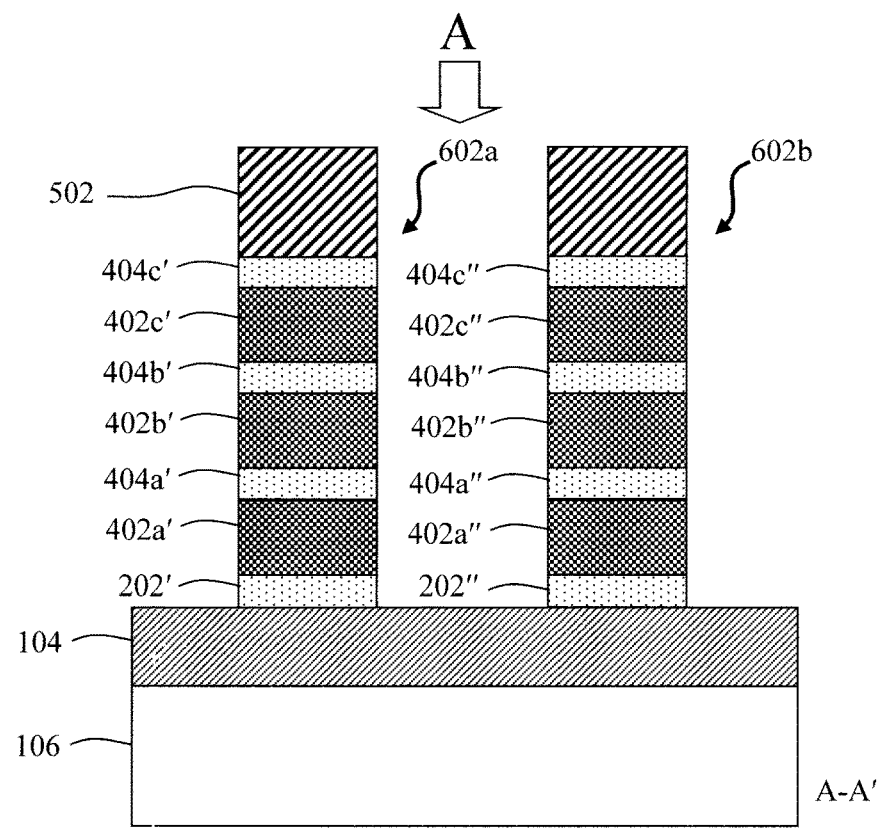
FIG. 6 is a cross-sectional diagram illustrating the fin hardmasks having been used to pattern at least one fin in the Si/SiGe layers according to an embodiment of the present invention.
Figure 7:
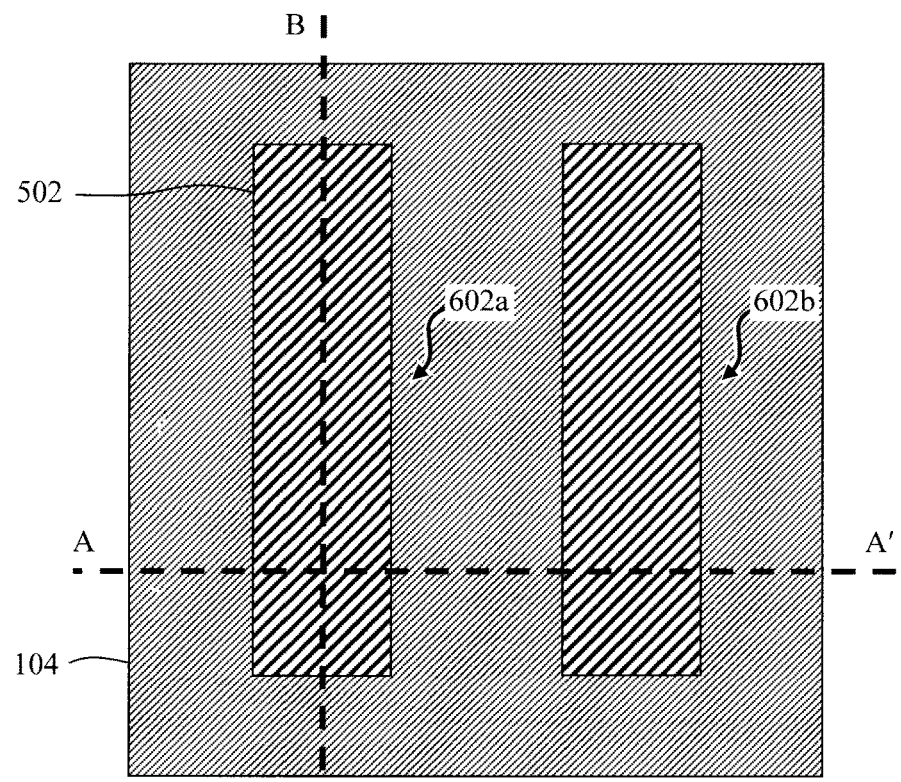
FIG. 7 is a top-down diagram illustrating the fin Si/SiGe stack structure according to an embodiment of the present invention.

FIG. 7 is a top-down view of the fin Si/SiGe stack structure (i.e., from viewpoint A—see FIG. 6). As shown in FIG. 7, several different cross-sectional views of the structure will be referenced herein. For example, in some instances (such as in FIG. 6) a cross-sectional view A-A' perpendicular to the fins 602 will be used. In other instances, a cross-sectional view B-B' that is parallel to the fins 602, through one of the fins (arbitrarily fin 602a in the present example).

Interface enhanced diffusion is then used to convert the Si/SiGe layers 402/404 into SiGe nanotubes surrounding an Si core. To do so, an oxide material is first deposited onto the fins 602a,b, etc. See oxide liner 802 in FIG. 8. It is at the interface between this oxide material and the Si/SiGe layers 402/404 that diffusion of Ge from the SiGe layers 404'/404" will occur to form the SiGe nanotubes.

Suitable oxide materials include, but are not limited to, silicon oxide (SiOx). According to an exemplary embodiment, the oxide liner 802 is deposited over the fins 602a,b, etc. using a conformal deposition process such as chemical vapor deposition (CVD), atomic layer deposition (ALD) or physical vapor deposition (PVD) to a thickness of from about 5 nm to about 20 nm and ranges therebetween. The use of a conformal oxide liner is however only one non-limiting example contemplated herein for creating this oxide-Si/SiGe interface along the fins 602a,b, etc. Alternatively, the fins 602a,b, etc. can be buried in an oxide fill material such as SiOx (not shown) followed by a polishing process such as chemical mechanical polishing (CMP).

Figure 8:
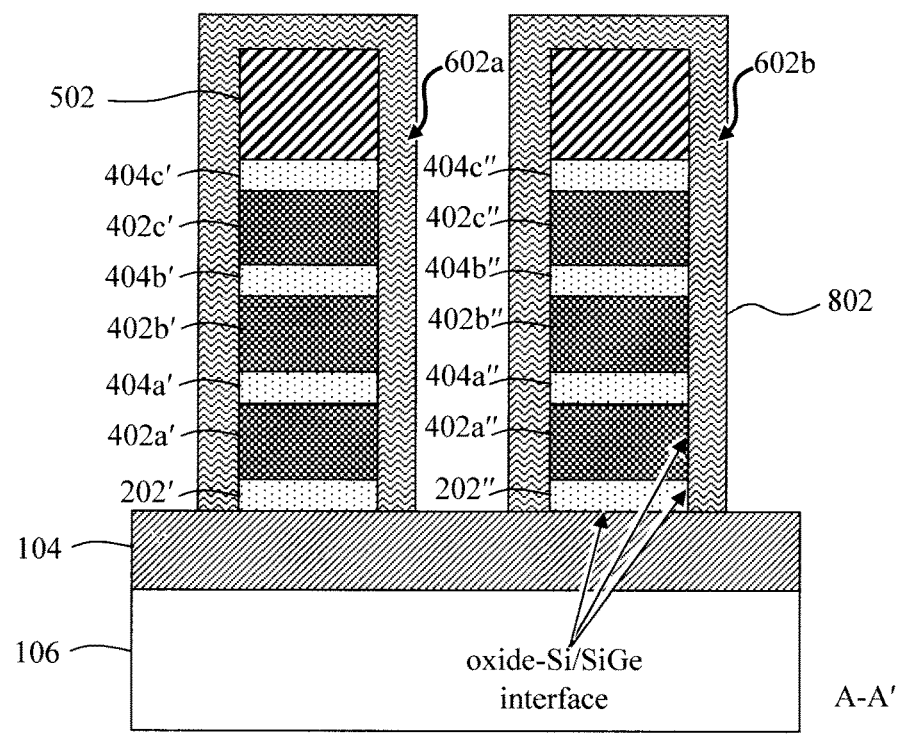
FIG. 8 is a cross-sectional diagram illustrating an oxide material having been deposited onto the fins according to an embodiment of the present invention.

As shown in FIG. 8, an oxide-Si/SiGe interface is now present between the buried insulator 104 (e.g., BOX) and SiGeOI layer 202, as well as between the oxide liner 802 and the Si/SiGe layers 402/404. As will be described in detail below, Ge diffusion along this oxide-Si/SiGe interface is enhanced, i.e., Ge diffuses much faster along this interface than it would in the fin itself. Namely, by way of example only, the Ge diffusion rate along this oxide-Si/SiGe interface can be at least two times the diffusion rate of Ge in Si. For examples illustrating this interface enhanced diffusion see, e.g., U.S. Pat. No. 9,570,299 issued to Cheng et al., entitled "Formation of SiGe Nanotubes," the contents of which are incorporated by reference as if fully set forth herein. If the proper annealing conditions are employed (see below), diffusion of Ge atoms from SiGe layers 404'/404" can be controlled to occur at the oxide-Si/SiGe interface without intermixing the Si/SiGe layers 402/404. As a result, SiGe nanotubes will be formed surrounding Si cores. The Si cores can then be removed to create hollow nanotubes.

Figure 9:
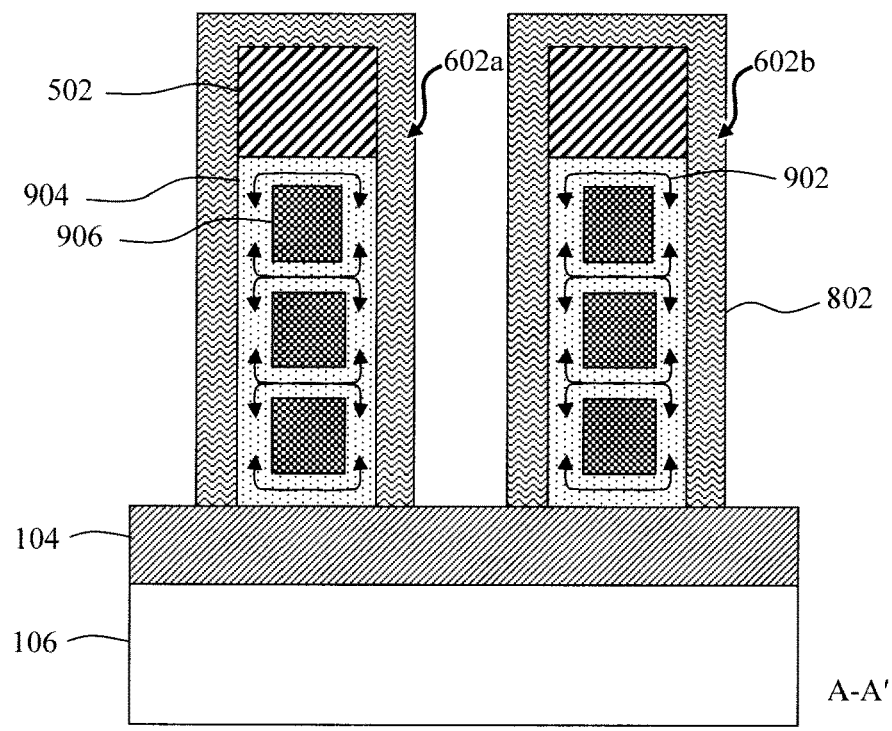
FIG. 9 is a cross-sectional diagram illustrating an anneal of the fins having been performed under conditions sufficient to diffuse Ge atoms from the SiGeOI and SiGe layers along the oxide-Si/SiGe interface while avoiding intermixing of the Si/SiGe layers, converting the fins into vertically stacked SiGe nanotubes surrounding Si cores according to an embodiment of the present invention.

Namely, as shown in FIG. 9, an anneal of the fins 602a,b, etc. is then performed under conditions sufficient to diffuse Ge atoms from the SiGeOI 202 and SiGe layers 404'/404" along the oxide-Si/SiGe interface while avoiding intermixing of the Si/SiGe layers 402/404. Arrows 902 are provided in FIG. 9 to illustrate this diffusion pattern. The result is that the fins 602a,b, etc. are converted into vertically stacked SiGe nanotubes 904 surrounding Si cores 906.

Specifically, comparing FIG. 8 and FIG. 9, Ge atoms from the SiGeOI 202 and SiGe layers 404'/404" diffuses laterally and vertically (i.e., upward/downward) along the interface with buried insulator (e.g., BOX) 104 and oxide liner 802. These Ge atoms condense in the Si layers 402'/402" along the interface forming vertical SiGe sidewalls of the SiGe nanotubes 904. These vertical SiGe sidewalls in combination with the horizontal SiGeOI 202 and SiGe layers 404'/404" surround the Si layers 402'/402" (no Si/SiGe intermixing occurs), which forms the Si cores 906. The Si layers 402 become narrower because the Ge atoms diffuse from the SiGe and mix with the Si to form the vertical SiGe sidewalls.

According to an exemplary embodiment, the anneal of the fins 602a,b, etc. is performed at a temperature of from about 400° C. to about 1200° C. and ranges therebetween, for example from about 500° C. to about 800° C. and ranges therebetween, for a duration of from about 1 millisecond to about 60 minutes and ranges therebetween, for example from about 30 seconds to about 5 minutes and ranges therebetween. In one exemplary embodiment, the anneal of the fins 602a,b, etc. is performed in an ambient containing an inert gas such as He, Ar, $N_2$, Xe, Kr and/or Ne.

Figure 10:
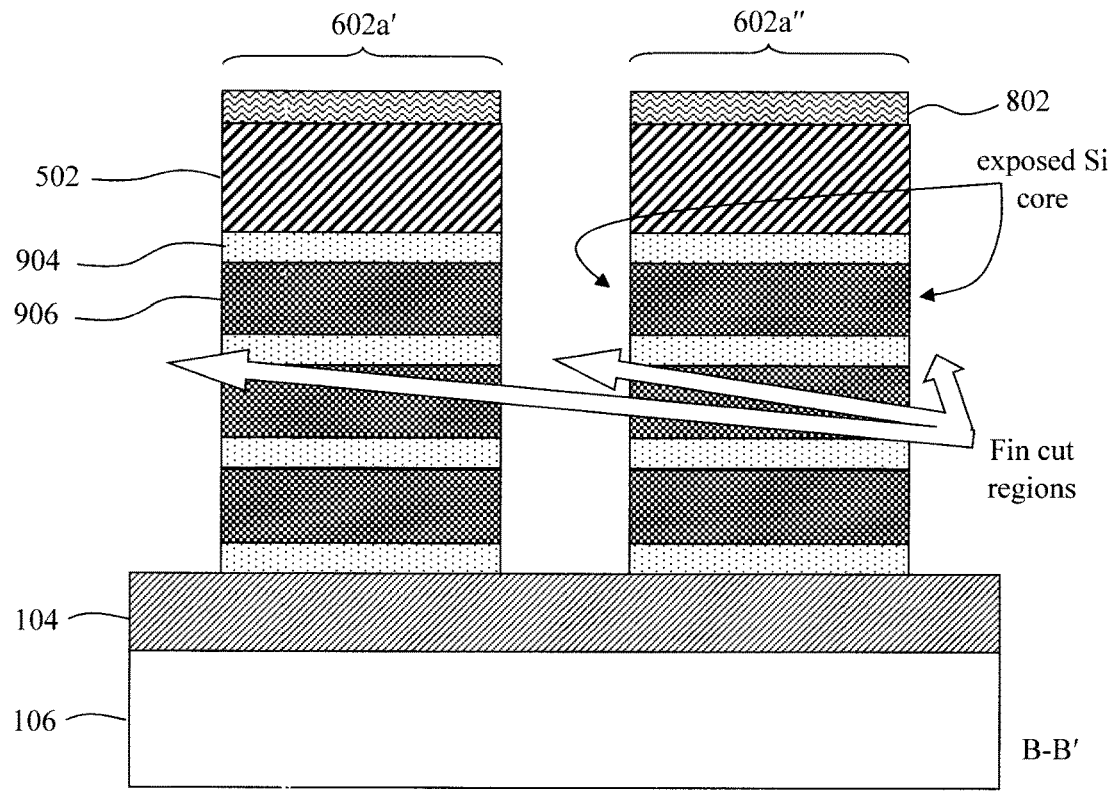
FIG. 10 is a cross-sectional diagram illustrating order to permit selective removal of the Si cores, a fin cut having been performed to open the ends of the stacked SiGe nanotubes, exposing the Si cores according to an embodiment of the present invention.
Figure 11:
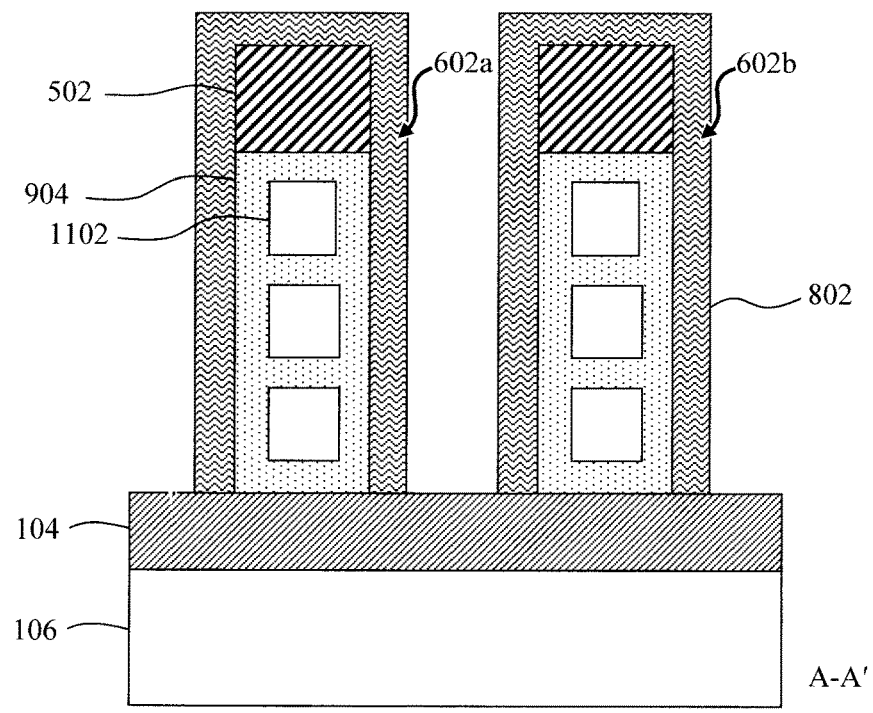
FIG. 11 is a cross-sectional diagram illustrating the Si cores having been removed selective to the SiGe nanotubes according to an embodiment of the present invention.

In order to permit selective removal of the Si cores 906, a fin cut is next performed to open the ends of the stacked SiGe nanotubes 904, exposing the Si cores 906. See FIG. 10. FIG. 10 provides a cross-sectional view B-B' (see FIG. 7) that is parallel to the fins 602, through one of the fins (i.e., fin 602a). As shown in FIG. 10, the fin cut involves etching the fins 602 in one or more fin cut regions. In the present example, a cut in the center of the fin is also performed to divide fin 602a into two fin sections 602a' and 602a". This center fin cut is, however, optional depending on the desired final length of the fins. Embodiments are contemplated herein where a center fin cut is not performed (only the ends of the stack are cut). See, for example, FIG. 12—described below. Following the fin cut, the ends of the Si cores 906 are exposed. See FIG. 10.

Once exposed, the Si cores 906 can be removed selective to the SiGe nanotubes 904. See FIG. 11. A non-directional (isotropic) etching process can be used to selectively remove the Si cores 906. For instance, according to an exemplary embodiment, the Si cores 906 are etched using a Si-selective, ammonia-based wet etch chemistry such as tetra methyl ammonium hydroxide (TMAH).

The result is a plurality of stacked SiGe nanotubes 904 having hollow cavities 1102. See FIG. 11. As highlighted above, the dimensions of the cavity 1102 can be controlled via the thickness of the Si layers 402a,b,c, etc. in the starting stack. Namely, since the process is tightly controlled for forming the SiGe nanotubes 904 (i.e., via interface enhanced diffusion and low annealing temperatures—see above), there is no Si/SiGe intermixing. Thus, the thickness of the Si layers 402a,b,c, etc. directly correlates with the final dimensions of the cavities 1102.

If so desired, the fin hardmasks 502 and/or oxide liner 802 can then be removed. What remains are SiGe nanotube stacks disposed on the wafer, i.e., on buried insulator 104 over substrate 106. Each stack includes multiple, vertically aligned SiGe nanotubes 904 having hollow cavities 1102.

Figure 12:
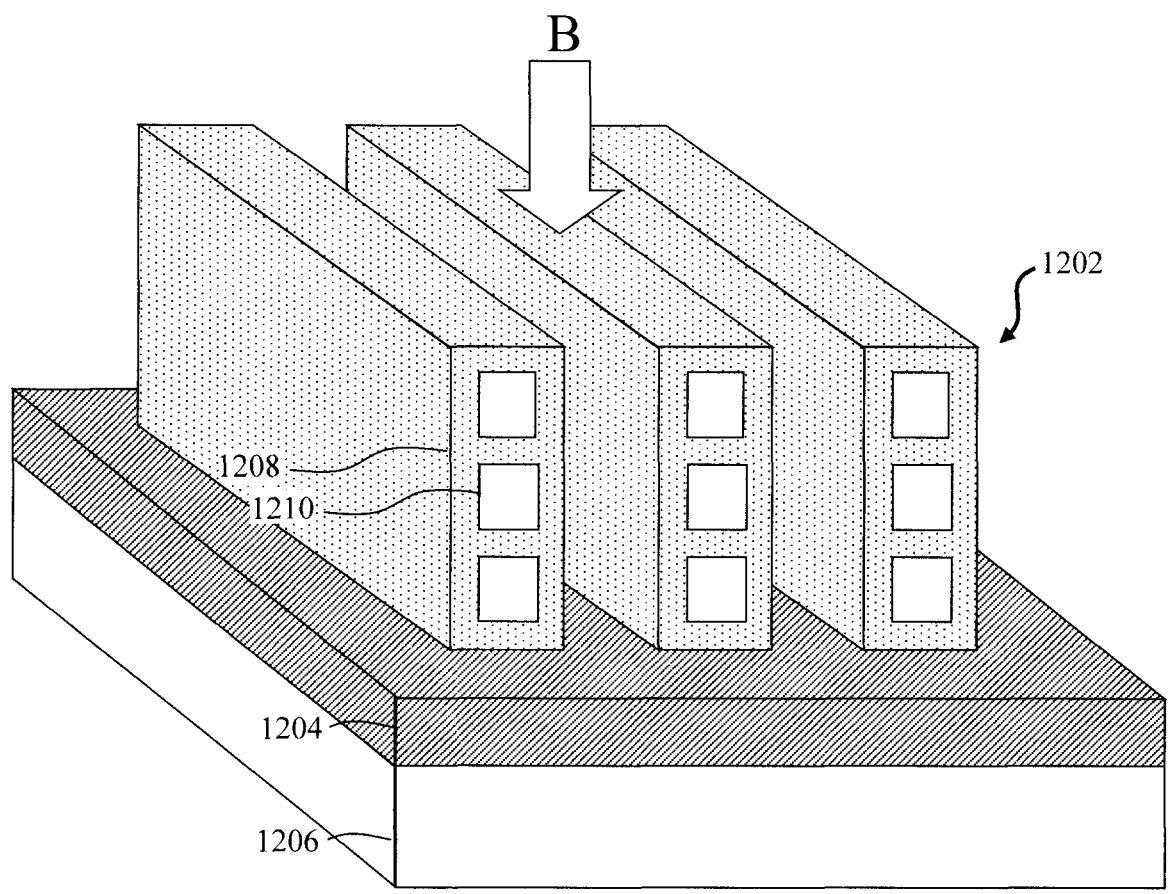
FIG. 12 is a three-dimensional diagram illustrating SiGe nanotube stacks formed on a wafer according to an embodiment of the present invention.

For instance, FIG. 12 is a three-dimensional depiction of SiGe nanotube stacks 1202 formed on a wafer in accordance with the present techniques. As shown in FIG. 12, the SiGe nanotube stacks 1202 are disposed on buried insulator 1204 over substrate 1206. Each SiGe nanotube stack 1202 includes multiple, vertically aligned SiGe nanotubes 1208 having hollow cavities 1210.

As provided above, the present process can be employed to fabricate any number of SiGe nanotube stacks on a wafer. In the example illustrated in FIG. 12, three SiGe nanotube stacks 1202 have been formed. Further, as provided above a fin cut enables removal of the Si cores from the SiGe nanotubes. In some cases, however, only the ends of the fins are cut, i.e., to open the ends of the stacked SiGe nanotubes and expose the Si cores. Namely, as shown in FIG. 12, there is no center fin cut region as compared to the example shown in FIG. 10, described above.

Figure 13:
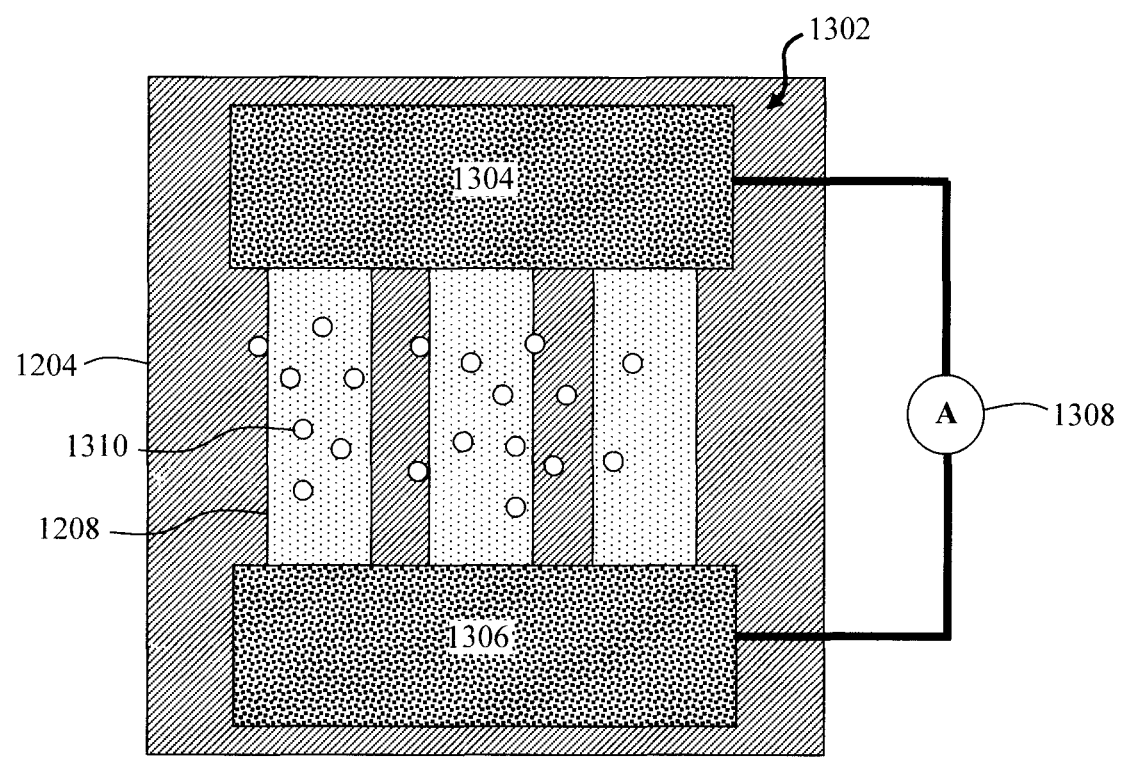
FIG. 13 is a top down-diagram illustrating an exemplary SiGe nanotube device according to an embodiment of the present invention.

The SiGe nanotube stacks 1202 fabricated in accordance with the present techniques can be used for a variety of applications such as logic/memory devices, sensors, etc. For instance, by way of example only, FIG. 13 is a top-down diagram (i.e., from viewpoint B—see FIG. 12) which illustrates an exemplary sensor 1302 built using the SiGe nanotube stacks 1202.

To form the sensor 1302, electrodes 1304 and 1306 are formed in contact with opposite ends of the SiGe nanotube stacks 1202. According to an exemplary embodiment, electrodes 1304 and 1306 are formed from an electrically conductive material or combination of materials, such as one or more contact metals. Suitable contact metals include, but are not limited to, copper (Cu), platinum (Pt), nickel (Ni) and/or gold (Au). For instance, according to one embodiment, a contact metal(s) is first deposited onto the SiGe nanotube stacks 1202 using a process such as evaporation, sputtering, electrochemical plating, etc. The metal is then patterned to form the individual electrodes 1304 and 1306.

The sensor 1302 is configured to detect a particular analyte such as a biological compound, chemical compound, gas, etc. For instance, according to an exemplary embodiment, sensor 1302 is a gas sensor. During operation, a conductivity meter 1308 (e.g., an ammeter) is used to measure the conductivity of the SiGe nanotube stacks 1202 between the electrodes 1304 and 1306. The physical properties of the SiGe nanotube stacks 1202 change upon exposure to gas molecules 1310. See, for example, Lee, "Electrodes for Semiconductor Gas Sensors," Sensors, 17, 683 (March 2017) (19 pages), the contents of which are incorporated by reference as if fully set forth herein. For instance, when gas molecules 1310 adsorb onto the surfaces of the SiGe nanotube stacks 1202, carriers are induced in the SiGe nanotube stacks 1202 which thereby change the conductivity of the SiGe nanotube stacks 1202. See, for example, U.S. Pat. No. 9,570,299 issued to Cheng et al., entitled "Formation of SiGe Nanotubes" (hereinafter "U.S. Pat. No. 9,570,299") the contents of which are incorporated by reference as if fully set forth herein. See also, Kong et al., "Nanotube Molecular Wires as Chemical Sensors," Science, vol. 287, pps. 622-625 (January 2000), the contents of which are incorporated by reference as if fully set forth herein.

Advantageously, the present techniques enable the formation of multiple stacks 1202 of SiGe nanotubes, each stack having multiple levels of SiGe nanotubes. Thus, advantageously, the surface area for detection is greatly increased, as compared to other designs (see, for example, U.S. Pat. No. 9,570,299).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a silicon germanium (SiGe) nanotube stack, the method comprising the steps of:
    forming silicon (Si) and SiGe layers on a wafer, one on top of another, in an alternating manner;
    forming at least one fin hardmask on top of the Si and SiGe layers;
    patterning at least one fin in the Si and SiGe layers using the at least one fin hardmask;
    depositing an oxide material onto the at least one fin and over the at least one fin hardmask; and
    annealing the at least one fin under conditions sufficient to diffuse germanium (Ge) atoms from the SiGe layers along an interface between the oxide material and the Si and SiGe layers to form at least one vertical stack of SiGe nanotubes surrounding Si cores.

2. The method of claim 1, wherein the conditions comprise a temperature and a duration.

3. The method of claim 2, wherein the temperature is from about 400° C. to about 1200° C. and ranges therebetween.

4. The method of claim 2, wherein the duration is from about 1 millisecond to about 60 minutes and ranges therebetween.

5. The method of claim 1, wherein the annealing is performed in an ambient comprising an inert gas selected from the group consisting of: helium (He), argon (Ar), nitrogen ($N_2$), xenon (Xe), krypton (Kr), neon (Ne), and combinations thereof.

6. The method of claim 1, further comprising the step of: selectively removing the Si cores.

7. The method of claim 1, wherein the oxide material comprises a conformal oxide liner deposited onto the at least one fin.

8. The method of claim 1, wherein multiple fins are patterned in the Si and SiGe layers, and wherein multiple vertical stacks of SiGe nanotubes are formed.

9. The method of claim 1, further comprising the step of: removing the oxide material.

10. The method of claim 9, further comprising the step of: forming electrodes in contact with opposite ends of the at least one vertical stack of SiGe nanotubes.

11. A method of forming a SiGe nanotube device, the method comprising the steps of:
    forming Si and SiGe layers on a wafer, one on top of another, in an alternating manner;
    forming at least one fin hardmask on top of the Si and SiGe layers;
    patterning at least one fin in the Si and SiGe layers using the at least one fin hardmask;
    depositing an oxide material onto the at least one fin and over the at least one fin hardmask;
    annealing the at least one fin under conditions sufficient to diffuse germanium (Ge) atoms from the SiGe layers along an interface between the oxide material and the Si and SiGe layers to form at least one vertical stack of SiGe nanotubes surrounding Si cores;
    selectively removing the Si cores;
    removing the oxide material; and
    forming electrodes in contact with opposite ends of the at least one vertical stack of SiGe nanotubes.

12. The method of claim 11, wherein the conditions comprise a temperature and a duration.

13. The method of claim 12, wherein the temperature is from about 400° C. to about 1200° C. and ranges therebetween.

14. The method of claim 12, wherein the duration is from about 1 millisecond to about 60 minutes and ranges therebetween.

15. The method of claim 11, wherein the annealing is performed in an ambient comprising an inert gas selected from the group consisting of: He, Ar, $N_2$, Xe, Kr, Ne, and combinations thereof.

16. The method of claim 11, wherein multiple fins are patterned in the Si and SiGe layers, and wherein multiple vertical stacks of SiGe nanotubes are formed.

* * * * *